US012013455B2

(12) United States Patent
Hur et al.

(10) Patent No.: US 12,013,455 B2
(45) **Date of Patent: *Jun. 18, 2024**

(54) ELECTRONIC DEVICES WITH BACKGROUND-CANCELLED ULTRA SHORT RANGE OBJECT DETECTION

(71) Applicant: Apple Inc., Cupertino, CA (US)

(72) Inventors: Joonhoi Hur, Sunnyvale, CA (US); Bernhard Sogl, Unterhaching (DE); Jochen Schrattenecker, Alberndorf in der Riedmark (AT); Andreas Menkhoff, Oberhaching (DE); Bin Xiao, San Ramon, CA (US); Lucas Calderin, Berkeley, CA (US); Andre Hanke, San Jose, CA (US); Harald Pretl, Schwertberg (AT); Rastislav Vazny, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 440 days.

This patent is subject to a terminal disclaimer.

(21) Appl. No.: 17/200,311

(22) Filed: Mar. 12, 2021

(65) Prior Publication Data

US 2022/0291338 A1 Sep. 15, 2022

(51) Int. Cl.
*G01S 13/08* (2006.01)
*G01R 27/06* (2006.01)
(Continued)

(52) U.S. Cl.
CPC .............. *G01S 13/08* (2013.01); *G01R 27/06* (2013.01); *G01S 7/003* (2013.01); *G01S 7/03* (2013.01); *G01S 7/412* (2013.01); *G01S 13/86* (2013.01)

(58) Field of Classification Search
CPC . G01S 13/08; G01S 7/003; G01S 7/03; G01S 7/412; G01S 13/86; G01R 27/06
See application file for complete search history.

(56) References Cited

U.S. PATENT DOCUMENTS 7,937,124 B2 5/2011 Chung et al.
9,594,147 B2 3/2017 Han et al.
(Continued)

FOREIGN PATENT DOCUMENTS

CN 108693520 A * 10/2018 ............. G01S 13/08
WO 2004098070 A2 11/2004
WO 2016003744 A1 1/2016

*Primary Examiner* — Matthew M Barker
(74) *Attorney, Agent, or Firm* — Treyz Law Group, P.C.; Michael H. Lyons

(57) ABSTRACT

An electronic device may include a processor and wireless circuitry with transmit and receive antennas. Radar circuitry may use the transmit and receive antennas to perform spatial ranging on external objects farther than a threshold distance (e.g., 1-2 cm) from the transmit antenna. The wireless circuitry may include a voltage standing wave ration (VSWR) sensor coupled to the transmit antenna to detect the presence of objects within the threshold distance from the transmit antenna. This may serve to cover a blind spot for the radar circuitry near to the transmit antenna. The VSWR sensor may gather background VSWR measurements when other wireless performance metric data for the wireless circuitry is within a predetermined range of satisfactory values. The background VSWR measurements may be subtracted from real time VSWR measurements to perform accurate and robust ultra-short range object detection near to the transmit antenna.

20 Claims, 8 Drawing Sheets

(51) Int. Cl.

| | |
|---|---|
| ***G01S 7/00*** | (2006.01) |
| ***G01S 7/03*** | (2006.01) |
| ***G01S 7/41*** | (2006.01) |
| ***G01S 13/86*** | (2006.01) |

(56) References Cited

U.S. PATENT DOCUMENTS

| | | | | |
|---|---|---|---|---|
| 9,769,769 | B2 * | 9/2017 | Harper | H04B 7/022 |
| 10,741,906 | B2 | 8/2020 | Gomez Angulo et al. | |
| 10,826,177 | B2 | 11/2020 | Mow et al. | |
| 2012/0212070 | A1 * | 8/2012 | Tanabe | H02J 50/90<br>307/104 |
| 2012/0295555 | A1 * | 11/2012 | Greene | H01Q 5/314<br>343/745 |
| 2013/0210477 | A1 * | 8/2013 | Peter | H04B 1/3838<br>455/73 |
| 2014/0370830 | A1 * | 12/2014 | Steer | H04W 52/18<br>455/127.1 |
| 2015/0162944 | A1 * | 6/2015 | Peter | H04B 17/103<br>455/73 |
| 2016/0087454 | A1 * | 3/2016 | Tanabe | H02J 50/60<br>307/104 |

* cited by examiner

ELECTRONIC DEVICES WITH BACKGROUND-CANCELLED ULTRA SHORT RANGE OBJECT DETECTION

FIELD

This disclosure relates generally to electronic devices and, more particularly, to electronic devices with wireless circuitry.

BACKGROUND

Electronic devices are often provided with wireless capabilities. An electronic device with wireless capabilities has wireless circuitry that includes one or more antennas. The wireless circuitry is sometimes used to perform spatial ranging operations in which radio-frequency signals are used to estimate a distance between the electronic device and external objects.

It can be challenging to provide wireless circuitry that accurately estimates this distance. For example, the wireless circuitry will often exhibit a blind spot near the device within which the wireless circuitry is unable to accurately detect the presence of external objects.

SUMMARY

An electronic device may include wireless circuitry controlled by one or more processors. The wireless circuitry may include at least a transmit antenna and a receive antenna. The wireless circuitry may include long range spatial ranging circuitry such as radar circuitry. The long range spatial ranging circuitry may be coupled to the receive antenna over a receive path. The long range spatial ranging circuitry may be coupled to the transmit antenna over a transmit path. The wireless circuitry may include wireless communications circuitry coupled to the transmit antenna over the transmit path. The long range spatial ranging circuitry may use the transmit and receive antennas to perform spatial ranging operations on external objects farther than a threshold distance (e.g., 1-2 cm) from the transmit antenna. The wireless circuitry may include ultra-short range (USR) detector circuitry disposed along the transmit path. The USR detector circuitry may detect the presence of external objects within the threshold distance from the transmit antenna. This may serve to cover an object detection blind spot for the long range spatial ranging circuitry close to the transmit antenna.

The USR detector circuitry may include a voltage standing wave ratio (VSWR) sensor. The VSWR sensor may include a directional coupler, switching circuitry, and a phase and amplitude detector, for example. The VSWR sensor may gather VSWR measurements such as complex scattering parameter values (e.g., $S_{11}$ values) in response to radio-frequency signals on the transmit path. The VSWR sensor may gather VSWR measurements using radar signals transmitted by the long range spatial ranging circuitry, radio-frequency signals transmitted by the wireless communications circuitry, and/or test signals generated by a dedicated signal generator. The VSWR measurements may include background VSWR measurements and real time VSWR measurements.

The one or more processors may generate wireless performance metric data associated with the radio-frequency performance of the wireless circuitry (e.g., signal-to-noise ratio (SNR) values, receive signal strength indicator (RSSI) values, etc.). The background VSWR measurements may be performed when the wireless performance metric data is within a range of satisfactory wireless performance metric values. The real time VSWR measurements may be performed when the wireless performance metric data is outside of the range of satisfactory wireless performance metric values. The one or more processors may generate a difference value between the real time and background VSWR measurements. The one or more processors may determine that the external object is present when the difference value exceeds one or more threshold values. In order to further optimize the robustness of the VSWR measurements, the background and real time measurements may include open switch in-phase quadrature-phase (IQ) signal measurements and optionally matched load IQ signal measurements.

An aspect of the disclosure provides an electronic device. The electronic device can include a transmit antenna. The electronic device can include a receive antenna. The electronic device can include a voltage standing wave ratio (VSWR) sensor communicably coupled to the transmit antenna. The electronic device can include one or more processors. The one or more processors may be configured to use the transmit antenna and the receive antenna to perform spatial ranging operations on external objects located greater than a threshold distance away from the transmit antenna. The one or more processors may be configured to use the VSWR sensor to detect an external object located within the threshold distance from the transmit antenna.

An aspect of the disclosure provides an electronic device. The electronic device can include an antenna configured to transmit radio-frequency signals. The electronic device can include a radio-frequency transmission line communicably coupled to the antenna. The electronic device can include a voltage standing wave ratio (VSWR) sensor disposed along the radio-frequency transmission line. The electronic device can include one or more processors. The one or more processors may be configured to gather wireless performance metric data associated with reception of radio-frequency signals by the electronic device. The one or more processors may be configured to measure a first VSWR value using the VSWR sensor when the gathered wireless performance metric data exceeds a wireless performance metric threshold value. The one or more processors may be configured to measure a second VSWR value using the VSWR sensor when the gathered wireless performance metric data is less than the wireless performance metric threshold value. The one or more processors may be configured to reduce a maximum transmit power level of the radio-frequency signals transmitted by the antenna when a difference value between the second VSWR value and the first VSWR value exceeds a threshold value.

An aspect of the disclosure provides a method of operating wireless circuitry to perform external object detection. The method can include using a transmit antenna to transmit a radar signal. The method can include using a receive antenna to receive a reflected version of the radar signal transmitted by the transmit antenna. The method can include using one or more processors to identify a range from the transmit antenna to an external object farther than a threshold distance from the transmit antenna based on the radar signal transmitted by the transmit antenna and the reflected version of the radar signal received by the receive antenna. The method can include using a voltage standing wave ratio (VSWR) sensor to generate a background VSWR measurement and a real time VSWR measurement for the transmit antenna. The method can include using the one or more processors to identify that the external object is closer than the threshold distance from the antenna when a difference between the real time VSWR measurement and the background VSWR measurement exceeds a threshold value.

DETAILED DESCRIPTION

Figure 1:
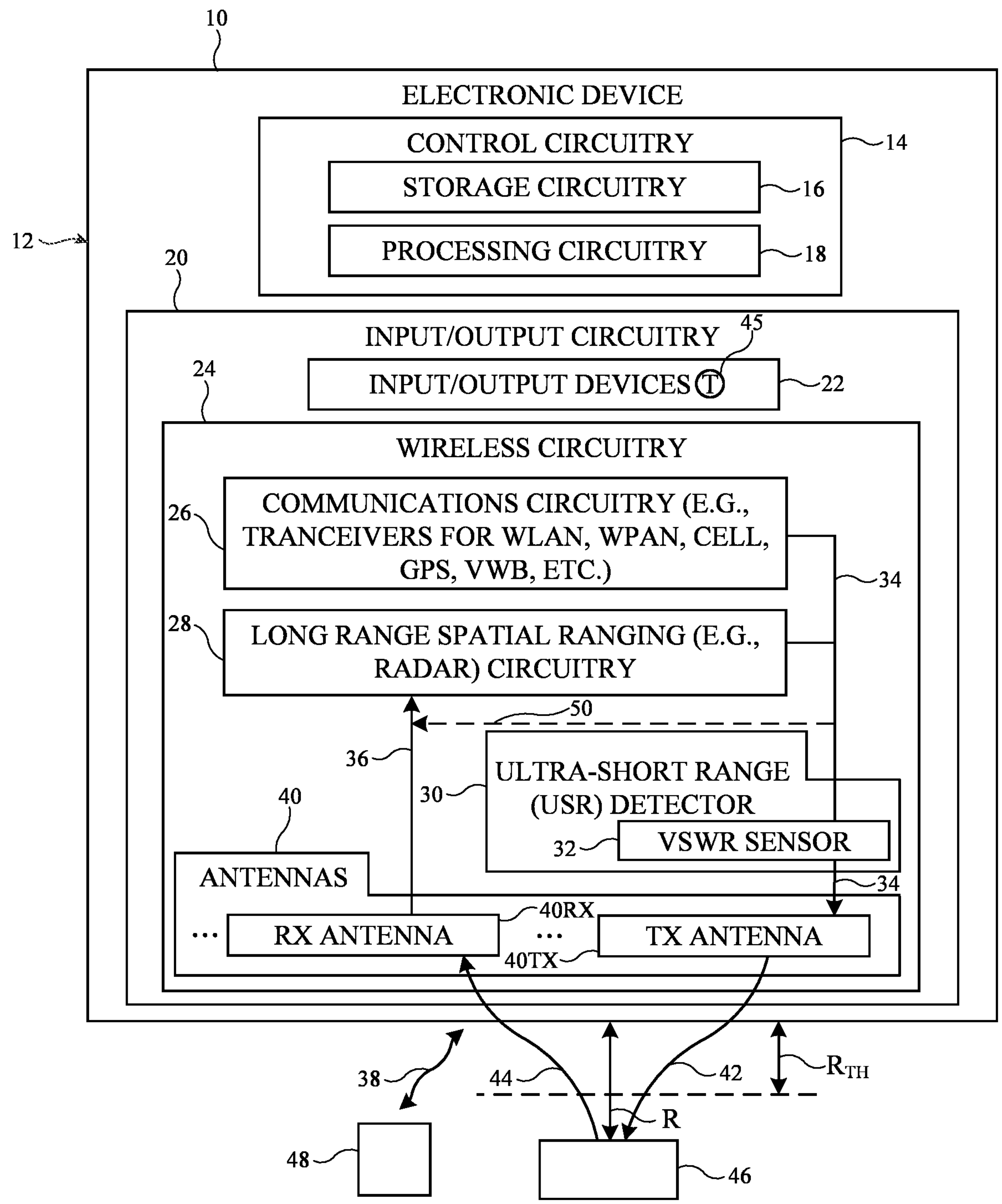
FIG. 1 is a functional block diagram of an illustrative electronic device having a transmit antenna that is used to perform long range object detection and that is used to perform ultra-short range (USR) object detection using a voltage standing wave ratio (VSWR) sensor in accordance with some embodiments.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed of plastic, glass, ceramics, fiber composites, metal (e.g., stainless steel, aluminum, metal alloys, etc.), other suitable materials, or a combination of these materials. In some situations, parts or all of housing 12 may be formed from dielectric or other low-conductivity material (e.g., glass, ceramic, plastic, sapphire, etc.). In other situations, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G protocols, etc.), antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link). In one embodiment that is described herein as an example, input-output devices 22 include one or more temperature (T) sensors 45. Temperature sensors 45 may measure ambient/environmental temperature at one or more locations at or around the exterior of device 10 and/or internal temperature at one or more locations within device 10 (e.g., within housing 12).

Input-output circuitry 20 may include wireless circuitry 24 to support wireless communications and/or radio-based spatial ranging operations. Wireless circuitry 24 may include two or more antennas 40. Wireless circuitry 24 may also include baseband processor circuitry, transceiver circuitry, amplifier circuitry, filter circuitry, switching circuitry, analog-to-digital converter (ADC) circuitry, digital-to-analog converter (DAC) circuitry, radio-frequency transmission lines, and/or any other circuitry for transmitting and/or receiving radio-frequency signals using antennas 40.

Antennas 40 may be formed using any desired antenna structures. For example, antennas 40 may include antennas with resonating elements that are formed from loop antenna structures, patch antenna structures, inverted-F antenna structures, slot antenna structures, planar inverted-F antenna structures, helical antenna structures, monopole antennas, dipoles, hybrids of these designs, etc. Filter circuitry, switching circuitry, impedance matching circuitry, and/or other antenna tuning components may be adjusted to adjust the frequency response and wireless performance of antennas 40 over time.

Antennas 40 may include one or more transmit (TX) antennas such as transmit antenna 40TX and one or more receive (RX) antennas such as receive antenna 40RX. Antennas 40 may include zero, one, or more than one additional antenna used in the transmission and/or reception of radio-frequency signals. Transmit antenna 40TX may transmit radio-frequency signals such as radio-frequency signals 42 and/or radio-frequency signals 38. Receive antenna 40RX may receive radio-frequency signals such as radio-frequency signals 44 and/or radio-frequency signals 38. Wireless circuitry 24 may use antennas 40 to transmit and/or receive radio-frequency signals 38 to convey wireless communications data between device 10 and external wireless communications equipment 48 (e.g., one or more other devices such as device 10, a wireless access point or base station, etc.). Wireless communications data may be conveyed by wireless circuitry 24 bidirectionally or unidirectionally. The wireless communications data may, for example, include data that has been encoded into corresponding data packets such as wireless data associated with a telephone call, streaming media content, internet browsing, wireless data associated with software applications running on device 10, email messages, etc.

Wireless circuitry 24 may include communications circuitry 26 (sometimes referred to herein as wireless communications circuitry 26) for transmitting and/or receiving wireless communications data using antennas 40. Communications circuitry 26 may include baseband circuitry (e.g., one or more baseband processors) and one or more radios (e.g., radio-frequency transceivers, modems, etc.) for conveying radio-frequency signals 38 using one or more antennas 40 (e.g., transmit antenna 40TX, receive antenna 40RX, and/or other antennas 40).

Communications circuitry 26 may transmit and/or receive radio-frequency signals 38 within a corresponding frequency band at radio frequencies (sometimes referred to herein as a communications band or simply as a "band"). The frequency bands handled by communications circuitry 26 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-300 GHz, near-field communications frequency bands (e.g., at 13.56 MHz), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest.

Communications circuitry 26 may be coupled to antennas 40 using one or more transmit paths and/or one or more receive paths. Communications circuitry 26 uses the transmit paths to transmit radio-frequency signals 38 and uses the receive paths to receive radio-frequency signals 38. If desired, communications circuitry 26 may be coupled to transmit antenna 40TX over a transmit path such as transmit path 34. Communications circuitry 26 may use transmit path 34 to transmit radio-frequency signals 38 using transmit antenna 40TX. Transmit path 34 (sometimes referred to herein as transmit chain 34) may include one or more signal paths (e.g., radio-frequency transmission lines), amplifier circuitry, filter circuitry, switching circuitry, radio-frequency front end circuitry (e.g., components on a radio-frequency front end module), and/or any other desired paths or circuitry for transmitting radio-frequency signals from communications circuitry 26 to transmit antenna 40TX.

In addition to conveying wireless communications data, wireless circuitry 24 may also use antennas 40 to perform spatial ranging operations. Wireless circuitry 24 may include long range spatial ranging circuitry 28 for performing spatial ranging operations. Long range spatial ranging circuitry 28 may include mixer circuitry, amplifier circuitry, transmitter circuitry (e.g., signal generators, synthesizers, etc.), receiver circuitry, filter circuitry, baseband circuitry, ADC circuitry, DAC circuitry, and/or any other desired components used in performing spatial ranging operations using antennas 40.

Long range spatial ranging circuitry 28 may include, for example, radar circuitry (e.g., frequency modulated continuous wave (FMCW) radar circuitry, OFDM radar circuitry, FSCW radar circuitry, a phase coded radar circuitry, other types of radar circuitry). Antennas 40 may include separate antennas for conveying wireless communications data and radio-frequency signals for spatial ranging or may include one or more antennas 40 that are used to both convey wireless communications data and to perform spatial ranging. Using a single antenna 40 to both convey wireless communications data and perform spatial ranging may, for example, serve to minimize the amount of space occupied in device 10 by antennas 40.

In one embodiment that is described herein as an example, wireless circuitry 24 may use transmit antenna 40TX to both convey wireless communications data for communications circuitry 26 and perform spatial ranging operations for long ranging spatial ranging circuitry 28. Long range spatial ranging circuitry 28 may therefore be coupled to transmit antenna 40TX over transmit path 34. When performing spatial ranging operations, long range spatial ranging circuitry 28 may use transmit antenna 40TX to transmit radio-frequency signals 42. Radio-frequency signals 42 may include one or more signal tones, continuous waves of radio-frequency energy, wideband signals, chirp signals, or any other desired transmit signals (e.g., radar signals) for use in spatial ranging operations. Unlike radio-frequency signals 38, radio-frequency signals 42 may be free from wireless communications data (e.g., cellular communications data packets, WLAN communications data packets, etc.). Radio-frequency signals 42 may sometimes also be referred to herein as spatial ranging signals 42, long range spatial ranging signals 42, or radar signals 42. Long range spatial ranging circuitry 28 may transmit radio-frequency signals 42 at one or more carrier frequencies in a corresponding radio frequency band such (e.g., a frequency band that includes frequencies greater than around 10 GHz, greater than around 20 GHz, less than 10 GHz, 20-30 GHz, greater than 40 GHz, etc.).

Radio-frequency signals 42 may reflect off of objects external to device 10 such as external object 46. External object 46 may be, for example, the ground, a building, part of a building, a wall, furniture, a ceiling, a person, a body part, an animal, a vehicle, a landscape or geographic feature, an obstacle, external communications equipment such as external wireless communications equipment 48, or any other physical object or entity that is external to device 10. Receive antenna 40RX may receive reflected radio-frequency signals 44. Reflected signals 44 may be a reflected version of the transmitted radio-frequency signals 42 that have reflected off of external object 46 and back towards device 10.

Receive antenna 40RX may be coupled to long range spatial ranging circuitry 28 over receive path 36 (sometimes referred to herein as receive chain 36). Long range spatial ranging circuitry 28 may receive reflected signals 44 from receive antenna 40RX via receive path 36. Receive path 36 may include one or more signal paths (e.g., radio-frequency transmission lines), amplifier circuitry (e.g., low noise amplifier (LNA) circuitry), filter circuitry, switching circuitry, radio-frequency front end circuitry (e.g., components on a radio-frequency front end module), and/or any other desired paths or circuitry for conveying radio-frequency signals from receive antenna 40RX to long range spatial ranging circuitry 28.

Control circuitry 14 may process the transmitted radio-frequency signals 42 and the received reflected signals 44 to detect or estimate the range R between device 10 and external object 46. If desired, control circuitry 14 may also process the transmitted and received signals to identify a two or three-dimensional spatial location (position) of external object 46, a velocity of external object 46, and/or an angle of arrival of reflected signals 44. If desired, a loopback path such as loopback path 50 may be coupled between transmit path 34 and receive path 36. Loopback path 50 may be used to convey transmit signals on transmit path 34 to receiver circuitry in long range spatial ranging circuitry 28. As an example, in embodiments where long range spatial ranging circuitry 28 performs spatial ranging using an FMCW scheme, loopback path 50 may be a de-chirp path that conveys chirp signals on transmit path 34 to a de-chirp mixer in long range spatial ranging circuitry 28. In these embodiments, doppler shifts in continuous wave transmit signals may be detected and processed to identify the velocity of external object 46, and the time dependent frequency difference between radio-frequency signals 42 and reflected signals 44 may be detected and processed to identify range R and/or the position of external object 46. Use of continuous wave signals for estimating range R may allow control circuitry 14 to reliably distinguish between external object 46 and other background or slower-moving objects, for example. This example is merely illustrative and, in general, long range spatial ranging circuitry 28 may implement any desired radar or long range spatial ranging scheme.

The radio-frequency transmission lines in transmit path 34 and receive path 36 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device may be integrated into rigid and/or flexible printed circuit boards if desired. One or more radio-frequency lines may be shared between transmit path 34 and receive path 36 if desired. The components of wireless circuitry 24 may be formed on one or more common substrates or modules (e.g., rigid printed circuit boards, flexible printed circuit boards, integrated circuits, chips, packages, systems-on-chip, etc.).

The example of FIG. 1 is merely illustrative. While control circuitry 14 is shown separately from wireless circuitry 24 in the example of FIG. 1 for the sake of clarity, wireless circuitry 24 may include processing circuitry that forms a part of processing circuitry 18 and/or storage circuitry that forms a part of storage circuitry 16 of control circuitry 14 (e.g., portions of control circuitry 14 may be implemented on wireless circuitry 24). As an example, some or all of the baseband circuitry in wireless circuitry 24 may form a part of control circuitry 14. In addition, wireless circuitry 24 may include any desired number of antennas 40. Antennas 40 may include more than one transmit antenna 40TX, more than one receive antenna 40RX, and zero, one, or more than one other antenna 40. Each antenna 40 may be coupled to communications circuitry 26 and/or long range spatial ranging circuitry 28 over dedicated transmit and/or receive paths or over one or more transmit and/or receive paths that are shared between antennas.

Long range spatial ranging circuitry 28 need not be coupled to all of the antennas 40 in wireless circuitry 24. Similarly, communications circuitry 26 need not be coupled to all of the antennas 40 in wireless circuitry 24 (e.g., some antennas 40 may be used to only perform spatial ranging operations without conveying wireless communications data or to only convey wireless communications data without performing spatial ranging). Antennas 40 that are only used to receive signals may be coupled to communications circuitry 26 and/or long range spatial ranging circuitry 28 using one or more receive paths (e.g., receive path 36). Antennas 40 that are only used to transmit signals may be coupled to communications circuitry 26 and/or long range spatial ranging circuitry 28 using one or more transmit paths (e.g., transmit path 34). One or more antennas 40 may be used to both transmit and receive signals. In these scenarios, the antenna may be coupled to communications circuitry 26 and/or long range spatial ranging circuitry 28 using both a transmit path and a receive path and, if desired, one or more components or signal paths (e.g., radio-frequency transmission lines) may be shared between both the transmit path and the receive path. While described herein as a transmit antenna for the sake of simplicity, transmit antenna 40TX may also be used in the reception of radio-frequency signals for communications circuitry 26 if desired (e.g., an additional receive path (not shown) may couple transmit antenna 40TX to communications circuitry 26). Similarly, receive antenna 40RX may also be used in the transmission of radio-frequency signals if desired. While receive antenna 40RX is only illustrated as providing reflected signals 44 to long range spatial ranging circuitry 28, receive antenna 40RX may also provide received radio-frequency signals 38 to communications circuitry 26 (e.g., receive path 36 may also couple receive antenna 40RX to communications circuitry 26).

Long range spatial ranging circuitry 28 may be used to accurately identify range R when external object 46 is at relatively far distances from device 10. However, in practice, long range spatial ranging circuitry 28 exhibits a blind spot to nearby external objects at distances less than threshold range $R_{TH}$ (e.g., around 1-2 cm) from device 10. When external object 46 is located within this blind spot (e.g., within threshold range $R_{TH}$ from transmit antenna 40TX), long range spatial ranging circuitry 28 may be unable to identify the presence, location, and/or velocity of external object 46 with a satisfactory level of accuracy. External objects 46 within threshold range $R_{TH}$ of transmit antenna 40TX may be exposed to relatively high amounts of radio-frequency energy (e.g., from the radio-frequency signals 38 and/or 42 that are transmitted by transmit antenna 40TX). In scenarios where external object 46 is a body part or person, if care is not taken, this transmitted radio-frequency energy may cause wireless circuitry 24 to exceed regulatory limits or other limits on specific absorption rate (SAR) (e.g., when the transmitted signals are at frequencies below 6 GHz) and/or maximum permissible exposure (MPE) (e.g., when the transmitted signals are at frequencies above 6 GHz). In order to detect the presence of external object 46 within threshold range $R_{TH}$ from transmit antenna 40TX, wireless circuitry 24 may include an ultra-short range (USR) object detector such as USR detector 30. USR detector 30 may serve to detect external object 46 at ultra-short ranges (e.g., at ranges within threshold range $R_{TH}$ from transmit antenna 40TX). In other words, USR detector 30 may perform external object detection within the blind spot of long range spatial ranging circuitry 28.

USR detector 30 may include a voltage standing wave ratio (VSWR) sensor such as VSWR sensor 32. VSWR sensor 32 may be interposed on transmit path 34. VSWR sensor 32 may gather VSWR values using transmit antenna 40TX. The VSWR values may include complex scattering parameter values (S-parameter values) such as reflection coefficient values (e.g., $S_{11}$ values). The magnitude of the $S_{11}$ values (e.g., $|S_{11}|$ values) may be indicative of the amount of transmitted radio-frequency energy that is reflected in a reverse direction along transmit path 34 (e.g., in response to the presence of external object 46 at or adjacent to transmit antenna 40TX). The VSWR values gathered by VSWR sensor 32 may be insensitive to situations where external object 46 is located at distances greater than threshold range $R_{TH}$ from transmit antenna 40TX. However, the VSWR values gathered by VSWR sensor 32 may allow control circuitry 14 to identify when external object 46 is located within threshold range $R_{TH}$ from transmit antenna 40TX (e.g., within the blind spot of long range spatial ranging circuitry 28).

In this way, USR detector 30 and long range spatial ranging circuitry 28 may identify the presence of external object 46 and optionally the range R to external object 46, regardless of whether external object 46 has moved to a position that is relatively close or relatively far from device 10 over time. In addition, USR detector 30 may identify the presence of external object 46 within the blind spot of long range spatial ranging circuitry 28 so that suitable action can be taken to ensure that wireless circuitry 24 continues to satisfy any applicable SAR and/or MPE regulations. By using the same transmit antenna 40TX to both transmit radio-frequency signals 38/42 and measure VSWR, the VSWR measurements will be very closely correlated with the amount of radio-frequency energy absorbed by external object 46 from the transmitted radio-frequency signals 38/42, thereby providing high confidence in the use of USR detector 30 for meeting any applicable SAR and/or MPE regulations (e.g., greater confidence than in scenarios where proximity sensors that are separate from the transmit antenna or transmit chain are used to identify the presence of external objects within threshold range $R_{TH}$ of device 10).

Figure 2:
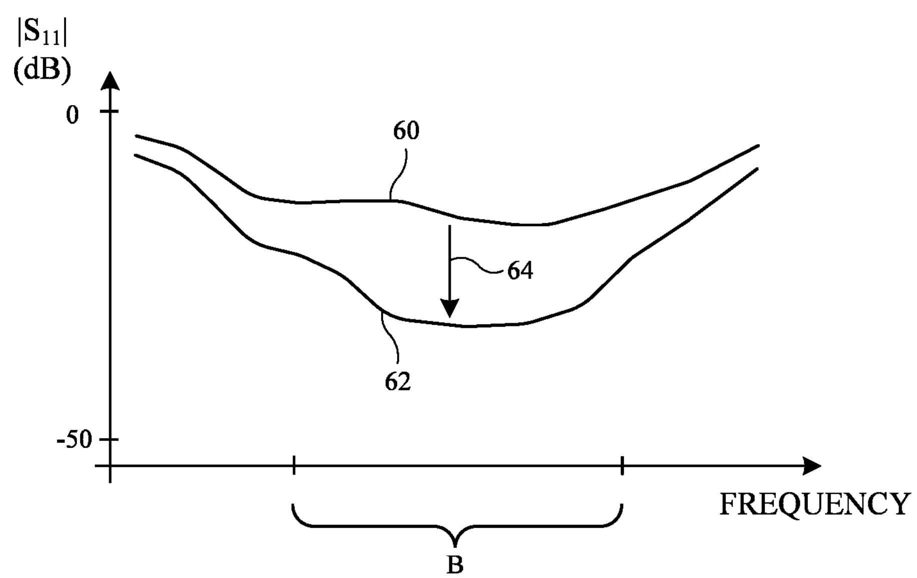
FIG. 2 is a plot of reflection coefficient as a function of frequency that may be produced by an illustrative VSWR sensor in response to the absence and presence of an external object in accordance with some embodiments.

FIG. 2 is a plot showing how VSWR measurements made by VSWR sensor 32 may change due to the presence of external object 46 adjacent to transmit antenna 40TX. Curve 60 plots the magnitude of reflection S-parameter $S_{11}$ (i.e., $|S_{11}|$) as a function of frequency in the absence of external object 46 within threshold range $R_{TH}$. As shown by curve 60, in the absence of external object 46, $|S_{11}|$ may have a relatively high value across a frequency band of interest B (e.g., the frequency band used to convey radio-frequency signals 38 or 42 of FIG. 1).

Curve 62 plots $|S_{11}|$ as a function of frequency when external object 46 is within threshold range $R_{TH}$ from transmit antenna 40TX. As shown by curve 62, $|S_{11}|$ may have a relatively low value across frequency band B due to the presence of external object 46. In general, once external object 46 is within threshold range $R_{TH}$, $|S_{11}|$ will continue to decrease, as shown by arrow 64 as the object approaches transmit antenna 40TX. Control circuitry 14 may gather VSWR values using VSWR sensor 32 (e.g., $|S_{11}|$ values such as those shown by curves 60 and 62) and may process the gathered VSWR values to identify when external object 46 is within threshold range $R_{TH}$ (e.g., by comparing the gathered Bill values to one or more threshold levels). Beyond threshold range $R_{TH}$, $|S_{11}|$ will exhibit no change or a negligible change in response to changes in distance between transmit antenna 40TX and external object 46. At these relatively far distances, long range spatial ranging circuitry 28 (FIG. 1) may be used to detect the presence, position (e.g., range R), and/or velocity of external object 46.

Figure 3:
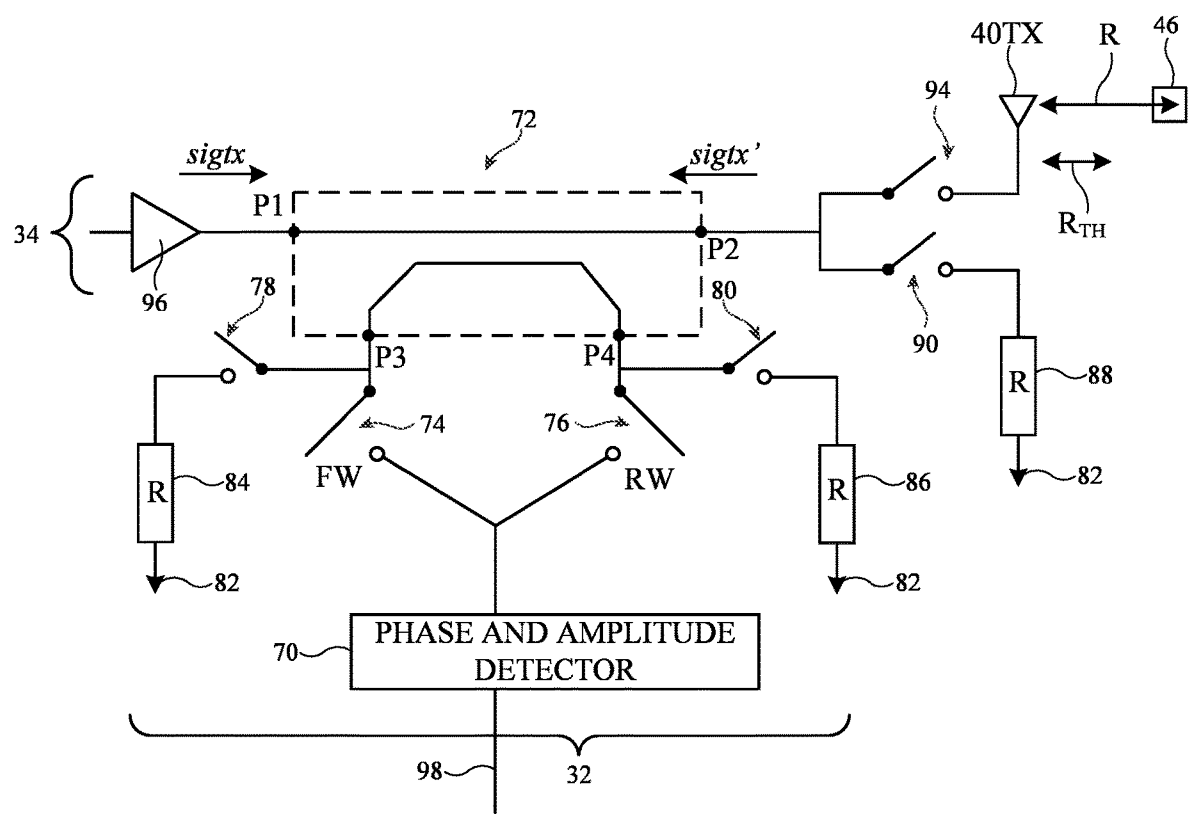
FIG. 3 is a circuit diagram of an illustrative VSWR sensor having a directional coupler for performing USR object detection using a transmit antenna in accordance with some embodiments.

FIG. 3 is a circuit diagram showing how VSWR sensor 32 maybe disposed on transmit path 34. As shown in FIG. 3, transmit path 34 may include a power amplifier (PA) such as PA 96. The input of PA 96 may be coupled to long range spatial ranging circuitry 28 and/or communications circuitry 26 of FIG. 1. The output of PA 96 may be coupled to transmit antenna 40TX via a switch such as antenna switch 94. The output of PA 96 may also be coupled to matched load 88 via a switch such as matched load switch 90. Matched load 88 may be coupled in series between matched load switch 90 and ground 82.

In the example of FIG. 3, VSWR sensor 32 is a directional switch coupler. This is merely illustrative and, in general, VSWR sensor 32 may be implemented using any desired VSWR sensor architecture. As shown in FIG. 3, VSWR sensor 32 may include directional coupler 72 interposed on transmit path 34 between PA 96 and transmit antenna 40TX (e.g., along a radio-frequency transmission line in transmit path 34 coupled between the output of PA 96 and transmit antenna 40TX). Directional coupler 72 may have a first port (P1) coupled to the output of PA 96 and a second port (P2) communicably coupled to transmit antenna 40TX. Directional coupler 72 may have a third port (P3) coupled to a first termination that includes resistor 84 coupled in series between termination switch 78 and ground 82. Directional coupler 72 may also have a fourth port (P4) coupled to a second termination that includes resistor 86 coupled in series between termination switch 80 and ground 82. VSWR sensor 32 may have a forward (FW) switch 74 coupled between port P3 and phase and amplitude (magnitude) detector 70. VSWR sensor 32 may also have a reverse (RW) switch 76 coupled between port P4 and phase and amplitude detector 70. Phase and amplitude detector 70 may have a control path 98 coupled to other components in USR detector 30 or control circuitry 14 (FIG. 1).

When gathering VSWR measurements (e.g., S-parameter values such as $S_{11}$ values), PA 96 may output a transmit signal sigtx (e.g., while antenna switch 94 is closed). Transmit signal sigtx may be a radar transmit signal transmitted by long range spatial ranging circuitry 28 (e.g., radio-frequency signals 42 of FIG. 1), a wireless communications data transmit signal transmitted by communications circuitry 26 (e.g., radio-frequency signals 38 of FIG. 1), or a dedicated test signal for use in VSWR measurement (e.g., one or more tones transmitted by a signal generator, local oscillator, and/or other signal generation circuitry in USR detector 30 of FIG. 1).

In gathering VSWR measurements, VSWR sensor 32 may perform forward path measurements and reverse path measurements using transmit signal sigtx. When performing forward path measurements, FW switch 74 is closed, RW switch 76 is open, switch 80 is closed, and switch 78 is open so that transmit signal sigtx is coupled off from transmit path 34 by directional coupler 72 and routed to phase and amplitude director 70 through FW switch 74. Phase and amplitude detector 70 may measure and store the amplitude (magnitude) and/or phase of transmit signal sigtx for further processing (e.g., as a forward signal phase and magnitude measurement).

At least some of transmit signal sigtx will reflect off of transmit antenna 40TX (e.g., due to impedance discontinuities between transmit path 34 and transmit antenna 40TX subject to impedance loading from any external objects at or adjacent to transmit antenna 40TX) and back towards PA 96 as reflected transmit signal sigtx'. When performing reverse path measurements, FW switch 74 is open, RW switch 76 is closed, switch 80 is open, and switch 78 is closed so that reflected transmit signal sigtx' is coupled off of transmit path 34 by directional coupler 72 and routed to phase and amplitude director 70 through RW switch 76. Phase and amplitude detector 70 may measure and store the amplitude (magnitude) and/or phase of reflected transmit signal sigtx' for further processing (e.g., as a reverse signal phase and magnitude measurement). Control circuitry 14 may process the stored forward and reverse phase and magnitude measurements to identify complex scattering parameter values such as $S_{11}$ values. The $S_{11}$ values are characterized by a scalar magnitude $|S_{11}|$ and a corresponding phase. In this way, VSWR sensor 32 may measure VSWR values (e.g., $S_{11}$ values) that can be used to determine when external object 46 is located at a range R that is less than or equal to threshold range $R_{TH}$. Long range spatial ranging circuitry 28 (FIG. 1) may also use transmit antenna 40TX to identify range R when external object 46 is located at a range R that is beyond threshold range $R_{TH}$ from transmit antenna 40TX.

Figure 4:
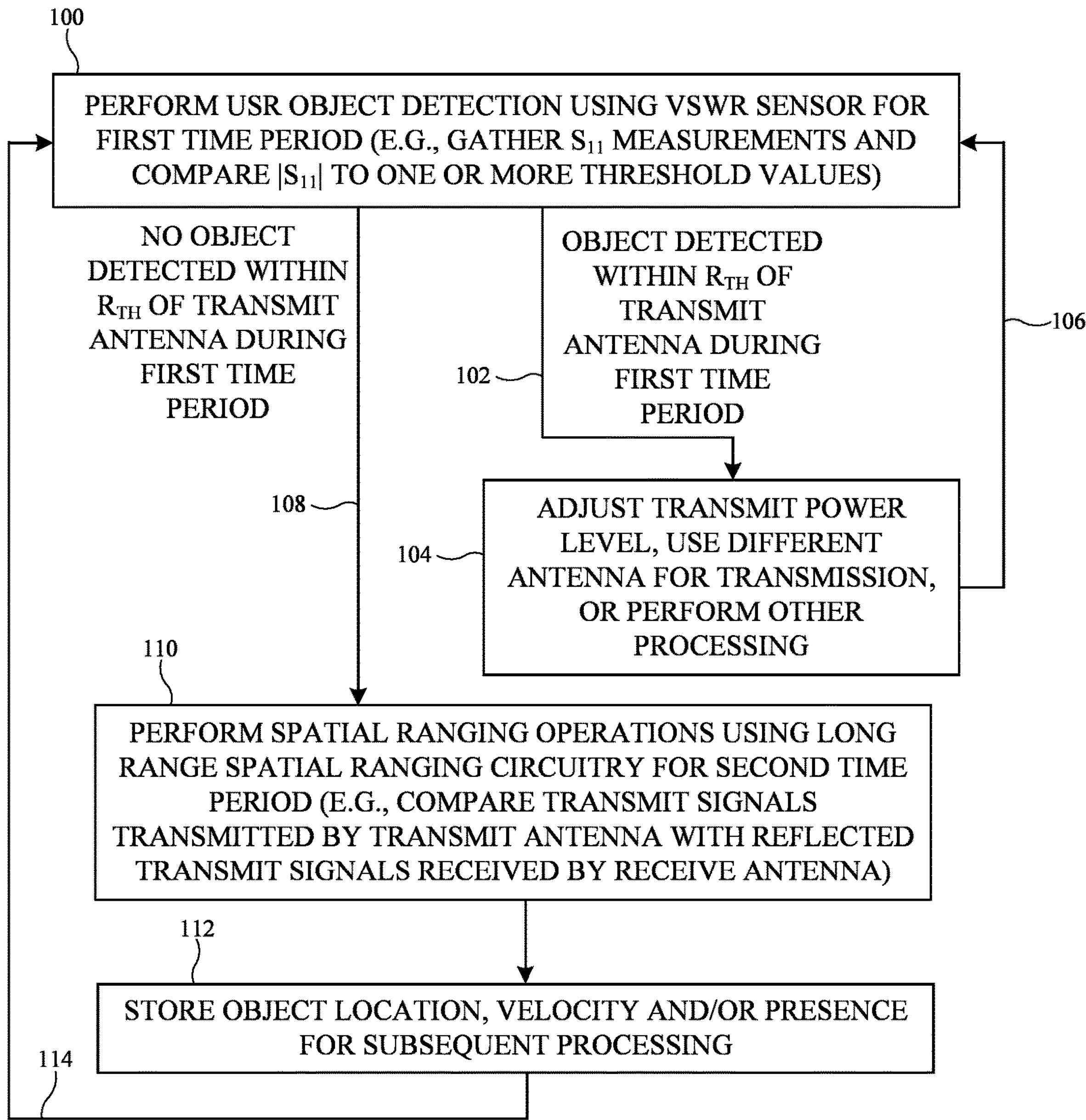
FIG. 4 is a flow chart of illustrative operations involved in using an illustrative transmit antenna to perform both long range object detection and USR object detection under a time multiplexing scheme in accordance with some embodiments.

FIG. 4 is a flow chart of illustrative operations that may be involved in using long range spatial ranging circuitry 28 (FIG. 1) to perform long range (far-field) spatial ranging operations and using VSWR sensor 32 to perform USR detection operations under a time multiplexing scheme. The time multiplexing scheme involves periodically switching between using transmit antenna 40TX to perform long range or USR detection over time to ensure that external object 46 can be detected even if external object 46 moves within or beyond threshold range $R_{TH}$ over time.

At operation 100, wireless circuitry 24 may perform USR object detection using VSWR sensor 32 for a first time period. The USR object detection may involve measuring $S_{11}$ values in response to transmit signals sigtx transmitted over transmit path 34. Control circuitry 14 may compare the magnitude of the $S_{11}$ values (e.g., $|S_{11}|$ values) to one or more threshold values associated with the presence of external objects within threshold range $R_{TH}$ of transmit antenna 40TX. If an object is detected within threshold range $R_{TH}$ (e.g., if the $|S_{11}|$ values fall below the threshold value), processing may proceed to operation 104 via path 102.

At operation 104, control circuitry 14 may take suitable action based on the detected (identified) presence of external object 46 within threshold range $R_{TH}$. For example, control circuitry 14 may reduce the transmit power level of subsequent transmit signals sigtx, may reduce the maximum permissible transmit power level of subsequent transmit signals sigtx, may switch a different antenna into use for the transmission of transmit signals sigtx, etc. This may help to ensure that wireless circuitry 24 continues to meet any applicable SAR/MPE regulations in the presence of external object 46 within threshold range $R_{TH}$. Processing may loop back to operation 100 via path 106 to continue to monitor for the presence of external object 46 within threshold range $R_{TH}$.

If no object is detected within threshold range $R_{TH}$ (e.g., if one or more of the $|S_{11}|$ values exceed the threshold value), processing may proceed to operation 110 via path 108. At operation 110, long range spatial ranging circuitry 28 may perform ranging operations using transmit antenna 40TX to detect the presence, position, and/or velocity of external object 46 beyond threshold range $R_{TH}$ from transmit antenna 40TX. Long range spatial ranging circuitry 28 may perform these operations for a second time period. This may, for example, involve the transmission of radio-frequency signals 42 using transmit antenna 40TX and the reception of reflected signals 44 using receive antenna 40RX (FIG. 1).

At operation 112, control circuitry 14 may store the position of external object 46 (e.g., range R) and/or the velocity of object 46 for subsequent processing. For example, one or more software applications running on device 10 may use the identified position/velocity to perform software tasks. If desired, control circuitry 14 may increase the transmit power level or the maximum permissible transmit power level of subsequent transmit signals sigtx. Processing may subsequently loop back to operation 100 via path 114, and wireless circuitry 24 may continue to alternate between USR detection and long range spatial ranging to identify the presence, position, and/or velocity of external object 46 over time, even if the external object moves within or beyond threshold range $R_{TH}$.

Figure 5:
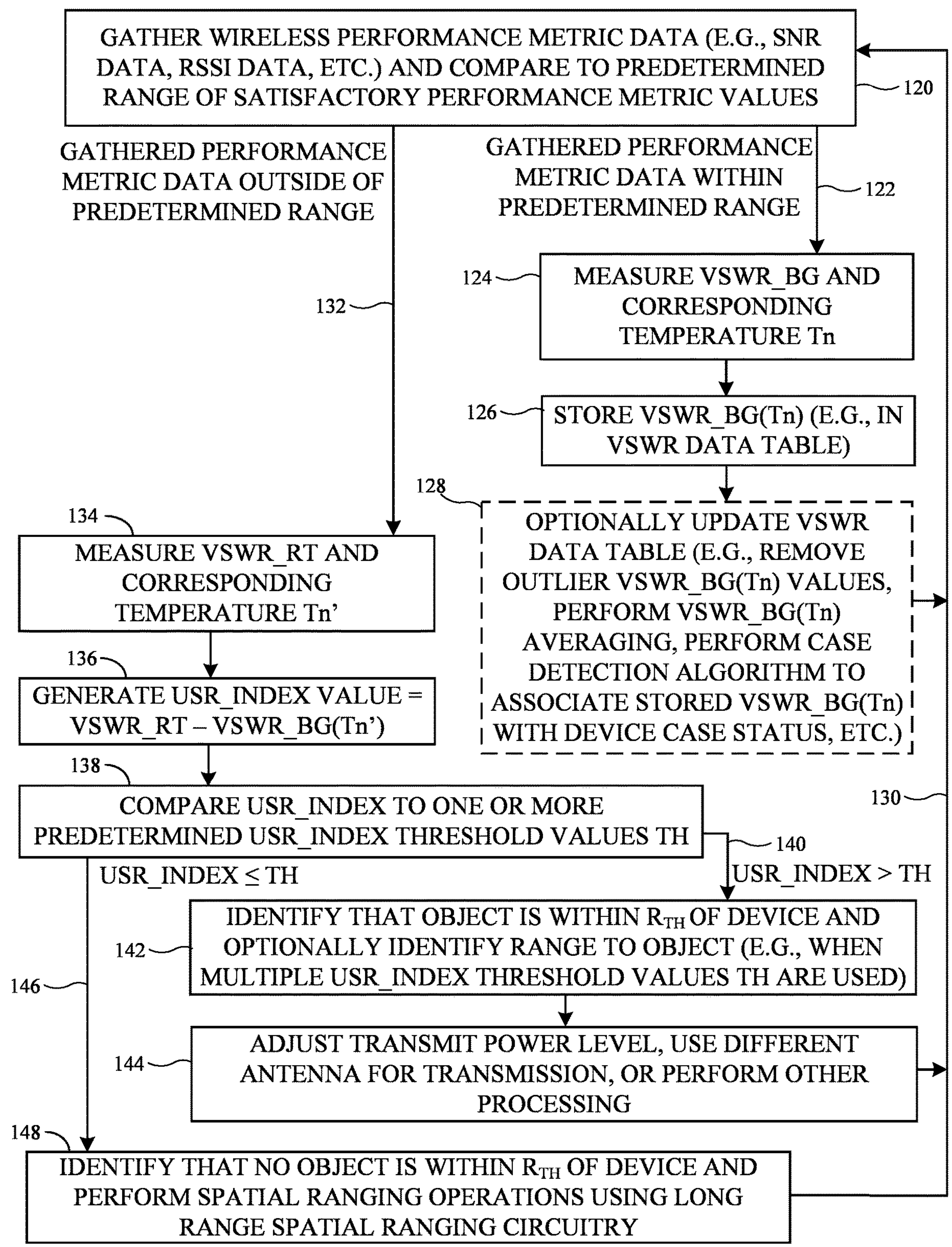
FIG. 5 is a flow chart of illustrative operations involved in performing background noise cancellation during USR object detection (e.g., using background-cancelled USR index values) in accordance with some embodiments.

In order to maximize the reliability and accuracy of the USR operations performed using VSWR sensor 32, VSWR sensor 32 may perform USR object detection using a background cancellation scheme. FIG. 5 is a flow chart of illustrative operations involved in using wireless circuitry 24 to perform long range spatial ranging operations and USR object detection using a background cancellation scheme.

In order to perform background cancellation, VSWR sensor 32 needs to characterize the background VSWR at transmit antenna 40TX in the absence of an external object within threshold range $R_{TH}$. At operation 120, wireless circuitry 24 may gather wireless performance metric data associated with the radio-frequency performance of transmit antenna 40TX and/or receive antenna 40RX. The wireless performance metric data may include signal-to-noise ratio (SNR) data, receive signal strength indicator (RSSI) data, or any other desired performance metric data gathered during the transmission of radio-frequency signals 38, the transmission of radio-frequency signals 42, the reception of radio-frequency signals 38, and/or the reception of reflected signals 44 of FIG. 1, for example. Control circuitry 14 may compare the gathered wireless performance metric data with a predetermined range of wireless performance metric values associated with satisfactory radio-frequency performance and/or the operation of wireless circuitry 24 in the absence of external objects within threshold range $R_{TH}$ (e.g., a predetermined range of satisfactory RSSI values, SNR values, etc.). The predetermined range of wireless performance metric values may be characterized by an upper threshold limit or value and/or a lower threshold limit or value.

The wireless performance metric data may serve as a coarse indicator for whether external object 46 is within threshold range $R_{TH}$. For example, if external object 46 is within range $R_{TH}$, external object 46 may partially block or cover one or more antennas 40 (thereby preventing the antenna from properly receiving radio-frequency signals), may undesirably load or detune one or more antennas 40 in device 10, etc. When the gathered wireless performance metric data falls outside of the predetermined range, this may be indicative of the potential presence of external object 46 within threshold range $R_{TH}$. However, when the gathered wireless performance metric data falls within the predetermined range, this may indicate that it is very unlikely that there is an external object present within threshold range $R_{TH}$ (e.g., because wireless circuitry 24 is performing nominally as expected in the absence of an external object within threshold range $R_{TH}$). If the gathered wireless performance metric data falls within the predetermined range (thereby indicating that there is no external object within threshold range $R_{TH}$), VSWR sensor 32 may be able to gather background VSWR measurements for performing background cancellation. Processing may thereby proceed to operation 124 via path 122.

At operation 124, VSWR sensor 32 may gather a background VSWR value (measurement) VSWR_BG using transmit signals sigtx provided to transmit antenna 40TX (FIG. 3). Background VSWR value VSWR_BG may include, for example, a background $S_{11}$ value. Temperature sensor 45 (FIG. 1) may also gather a temperature measurement Tn corresponding to the temperature at, around, and/or within device 10 when background VSWR measurement VSWR_BG was gathered. In general, VSWR measurements can be sensitive to temperature. For example, different VSWR measurements may be obtained under the same antenna loading conditions at different temperatures. By gathering temperature measurement Tn, control circuitry 14 may identify that the background VSWR value VSWR_BG corresponds to a particular temperature (e.g., to ensure that accurate VSWR measurements are made for performing USR detection even as temperature changes over time).

At operation 126, control circuitry 14 may store background VSWR value VSWR_BG and the corresponding temperature Tn (VSWR_BG(Tn)) in a VSWR data table for later processing (e.g., control circuitry 14 may associate the background VSWR_BG value with the corresponding temperature Tn in the VSWR data table so the control circuitry remains aware of the temperature at which the background VSWR value was gathered). Control circuitry 14 may store the VSWR data table in memory (e.g., storage circuitry 16 of FIG. 1) and/or using any desired data structure(s).

At optional operation 128, control circuitry 14 may update the stored VSWR data table. For example, control circuitry 14 may remove outlier background VSWR values VSWR_BG in the VSWR data table (e.g., VSWR_BG values that differ from the other VSWR_BG values in the VSWR data table by an excessive amount). This may help to ensure that the background VSWR values in the VSWR data table remain an accurate representation of the background VSWR measurement for VSWR sensor 32 over time. If desired, control circuitry 14 may average two or more of the background VSWR values VSWR_BG stored in the VSWR data table (e.g., so that the average background VSWR values are used instead of individual background VSWR measurements during subsequent processing). Any other desired data filtering operations may be performed on the VSWR data table.

If desired, control circuitry 14 may perform a case detection algorithm to detect whether a removable device case is present on device 10 (e.g., by comparing the gathered background VSWR values in the VSWR data table to expected background VSWR values for device 10 in the absence of a removable device case as determined during factory calibration or at other times). Control circuitry 14 may update the VSWR data table so that each stored background VSWR value VSWR_BG is associated with a case state identifier that identifies whether a removable device case was present on device 10 and/or what type of removable device case was present when that background VSWR value was gathered. Associating a case state identifier with the stored background VSWR values may allow control circuitry 14 to ensure that accurate VSWR measurements are made for performing USR detection even if the device has a removable case that may load the impedance of transmit antenna 40TX and even if a user removes, adds, or changes the device case over time.

Processing may subsequently loop back to operation 120 via path 130. Wireless circuitry 24 may perform only one iteration of operations 124-128 or may continue to gather background VSWR values VSWR_BG (e.g., adding to and/or updating the VSWR data table) periodically (e.g., according to a fixed schedule), for a predetermined number of iterations, in response to an application call or user input to device 10 (e.g., instructing wireless circuitry 24 to update or refresh its background VSWR measurements), and/or in response to any desired trigger condition. Long range spatial ranging circuitry 28 may concurrently perform long range spatial ranging operations using transmit antenna 40TX and/or communications circuitry 26 may concurrently perform wireless communications using transmit antenna 40TX during operations 120-128 if desired. When the wireless performance metric data gathered at operation 120 falls outside of the predetermined range, this may be indicative of the presence of a potential external object within threshold range $R_{TH}$ and processing may proceed to operation 134 via path 132.

At operation 134, VSWR sensor 32 may gather a real time (RT) VSWR value (measurement) VSWR_RT using transmit signals sigtx provided to transmit antenna 40TX (FIG. 3). Real time VSWR measurement VSWR_RT may include, for example, a real time $S_{11}$ value. Temperature sensor 45 (FIG. 1) may also gather a real time temperature measurement Tn' corresponding to the temperature at, around, and/or within device 10 when background VSWR measurement VSWR_RT was gathered.

At operation 136, control circuitry 14 may generate (calculate, compute, determine, identify, define, etc.) a USR index value USR_INDEX (sometimes referred to herein as background-cancelled reflection coefficient index value USR_INDEX) by subtracting a gathered background VSWR value VSWR_BG from real time VSWR value VSWR_RT. USR index value USR_INDEX may sometimes also be referred to herein as difference value USR_INDEX. If desired, the gathered background VSWR value VSWR_BG may be a background VSWR value VSWR_BG gathered while temperature sensor 45 measured temperature Tn' during an iteration of operation 124. Control circuitry 14 may, for example, identify a background VSWR value VSWR_BG from the stored VSWR data table that is associated with measured temperature Tn=Tn' in the VSWR data table. If there are no background VSWR values VSWR_BG in the data table that are associated with measured temperature Tn', the control circuitry may use the background VSWR value measured at the temperature Tn closest to measured temperature Tn', may interpolate multiple background VSWR values to estimate a background VSWR value VSWR_BG at measured temperature Tn' for subtraction from real time VSWR value VSWR_RT, etc. In embodiments where the case detection algorithm is performed, control circuitry 14 may subtract a background VSWR_BG value corresponding to the current case state of device 10 (and temperature Tn') from real time VSWR value VSWR_RT (e.g., based on case state identifiers in the VSWR data table).

At operation 138, control circuitry 14 may compare USR index value USR_INDEX to one or more predetermined USR index threshold values TH. USR index threshold value TH may correspond to a VSWR measurement (e.g., an $|S_{11}|$ value) associated with the presence of external objects at threshold range $R_{TH}$ from transmit antenna 40TX. If a single USR index threshold value TH is used, the comparison may allow control circuitry 14 to identify the presence of external object 46 within threshold range $R_{TH}$. If multiple index threshold values TH are used, the comparison(s) may also allow control circuitry 14 estimate the range R to external object 46 within threshold range $R_{TH}$. If USR index value USR_INDEX exceeds USR index threshold value TH, this may be indicative of the presence of external object 46 within threshold range $R_{TH}$ and processing may proceed to operation 142 via path 140.

At operation 142, control circuitry 14 may identify that external object 46 is within threshold range $R_{TH}$ of device 10 (transmit antenna 40TX). If multiple index threshold values TH are used, control circuitry 14 may further estimate the range R to external object 46 within threshold range $R_{TH}$ (e.g., where each index threshold value TH corresponds to a different range within threshold range $R_{TH}$).

At operation 144, control circuitry 14 may take further action based on the identified (detected) presence of external object 46 within threshold range $R_{TH}$. For example, control circuitry 14 may use the identified presence of external object 46 as an input to one or more software applications running on device 10 (e.g., software applications that perform operations based on whether or not an external object 46 is present within threshold range $R_{TH}$). Control circuitry 14 may control wireless circuitry 24 to reduce the transmit power level or the maximum transmit power level used to transmit subsequent radio-frequency signals using transmit antenna 40TX (e.g., radio-frequency signals 38 or 42 of FIG. 1). If desired, control circuitry 14 may control wireless circuitry 24 to switch transmit antenna 40TX out of use in favor of a different antenna in device 10. Reducing transmit power level, limiting maximum transmit power level, or switching transmit antenna 40TX out of use may prevent transmit antenna 40TX from transmitting an excessive amount of radio-frequency energy into the nearby external object 46, thereby allowing device 10 to continue to satisfy any applicable SAR/MPE regulations. Processing may subsequently loop back to operation 120 via path 130 and wireless circuitry 24 may continue to monitor the presence of external object 46 near transmit antenna 40TX (e.g., until external object 46 moves beyond threshold range $R_{TH}$, at which point long range spatial ranging circuitry 28 will be able to resume detection of external object 46).

When USR index value USR_INDEX is less than or equal to threshold value TH during the comparison in operation 138, this may be indicative of the absence of external object 46 within threshold range $R_{TH}$ and processing may proceed to operation 148 via path 146. At operation 148, control circuitry 14 may identify that no object is present within threshold range $R_{TH}$. Long range spatial ranging circuitry 28 may then use transmit antenna 40TX to detect/track the position of external object 46 beyond threshold range $R_{TH}$. If desired, control circuitry 14 may increase the transmit power level or the maximum transmit power level of transmit antenna 40TX. Any other desired processing operations may be performed in response to the absence of external object 46 within threshold range $R_{TH}$. Processing may subsequently loop back to operation 120 via path 130.

Figure 6:
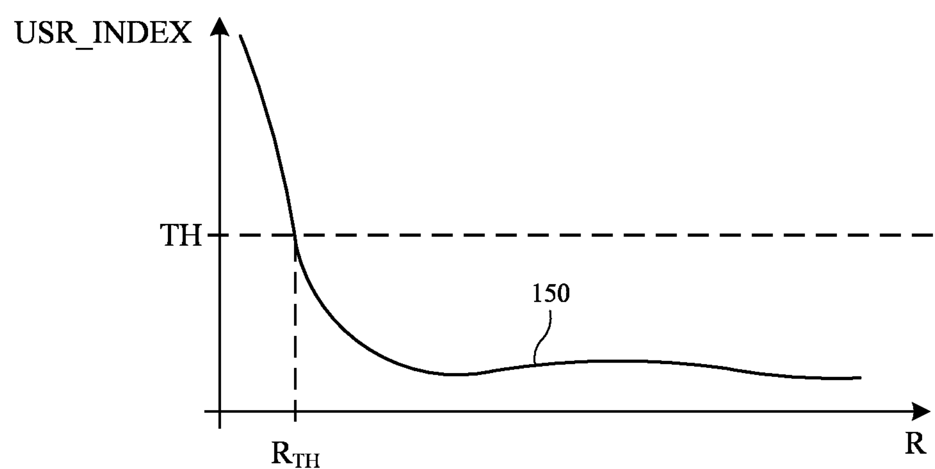
FIG. 6 is a plot of background-cancelled USR index values as a function of distance between a transmit antenna and an external object in accordance with some embodiments.

FIG. 6 is a plot of USR index value USR_INDEX (in units of V) as a function of the range R between external object 46 and transmit antenna 40TX. USR index values USR_INDEX are background-cancelled values because USR index values USR_INDEX are generated using a subtraction of background VSWR measurements from real time VSWR measurements made using VSWR sensor 32. As shown by curve 150 of FIG. 6, at relatively far ranges R, USR index value USR_INDEX is unperturbed by changes in range R. However, USR index value USR_INDEX will increase as external object 46 approaches threshold range $R_{TH}$ (e.g., within 1-2 cm of transmit antenna 40TX). Index threshold value TH may correspond to the USR index value USR_INDEX when external object 46 is located at threshold range $R_{TH}$ from transmit antenna 40TX. Control circuitry 14 may therefore determine that external object 46 is within threshold range $R_{TH}$ of transmit antenna 40TX when USR index value USR_INDEX exceeds index threshold value TH (e.g., during operation 138 of FIG. 5). The example of FIG. 6 is merely illustrative and, in general, curve 150 may have other shapes. Multiple index threshold values TH may be used (e.g., to provide an estimate of range R within threshold range $R_{TH}$).

Figure 7:
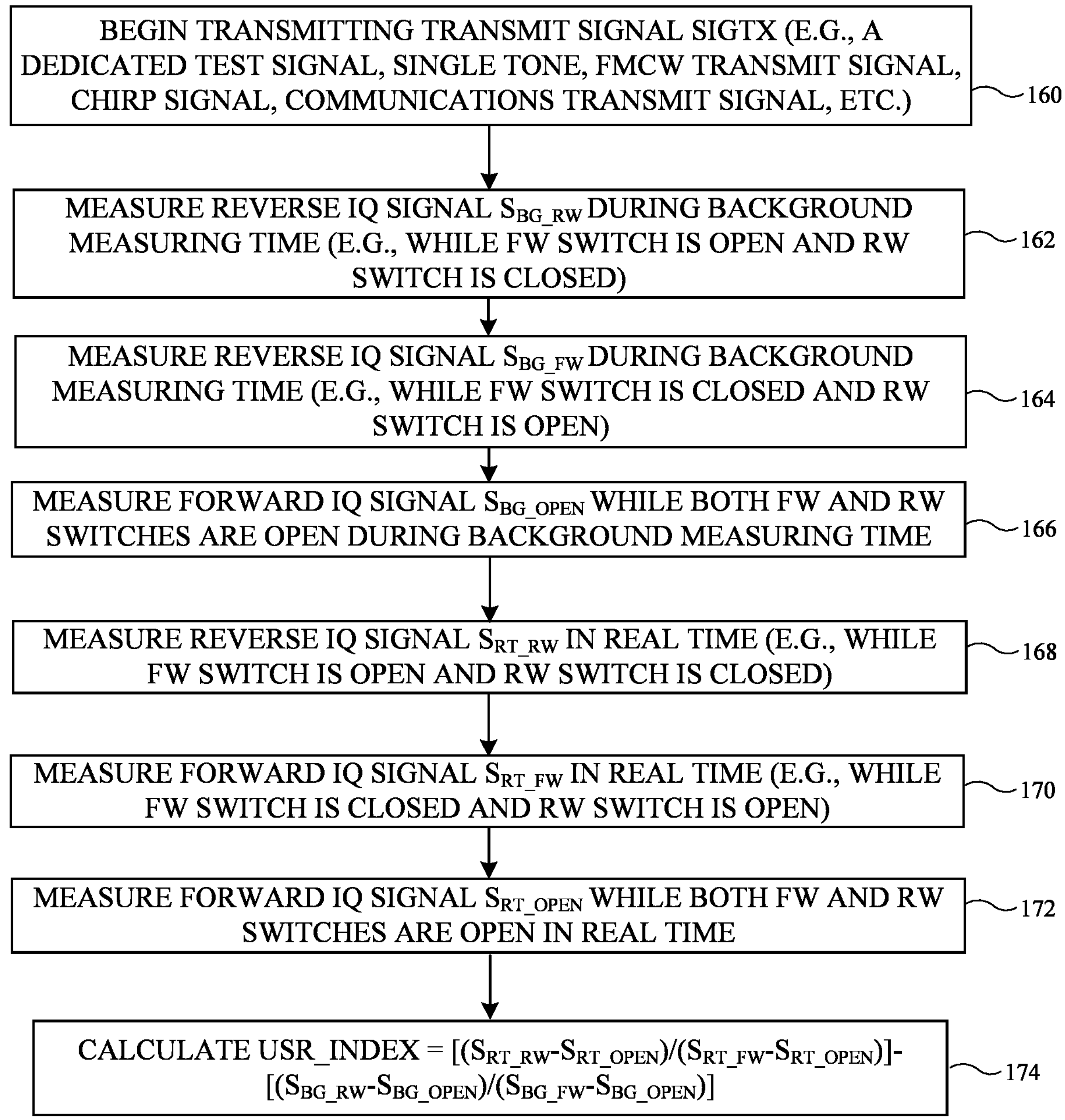
FIG. 7 is a flow chart of illustrative operations involved in generating background-cancelled USR index values in accordance with some embodiments.

If desired, additional calibration operations may be performed while gathering VSWR measurements to increase the robustness of the USR detection. FIG. 7 is a flow chart of illustrative operations that may be performed by control circuitry 14 when gathering VSWR measurements using these additional calibration operations. Operations 160-166 of FIG. 7 may be performed during operation 124 of FIG. 5, operations 168-172 of FIG. 7 may be performed during operation 134 of FIG. 5, and operation 174 may be performed during operation 136 of FIG. 5, for example.

At operation 160, PA 96 (FIG. 3) may begin transmitting transmit signal sigtx. Transmit signal sigtx may be a dedicated test signal (e.g., a single tone, multiple tones, or other transmit signals produced by a signal generator separate from communications circuitry 26 and long range spatial ranging circuitry 28 of FIG. 1), may be a communication transmit signal generated by communications circuitry 26 (e.g., radio-frequency signals 38), or may be a transmit signal generated by long range spatial ranging circuitry 28 (e.g., radio-frequency signals 42).

At operation 162, control circuitry 14 may use VSWR sensor 32 (e.g., phase and amplitude detector 70 or other signal measurement circuitry) to measure a reverse background in-phase quadrature-phase (IQ) signal $S_{BG\_RW}$. During this measurement, antenna switch 94 of FIG. 3 is closed, FW switch 74 is open, RW switch 76 is closed, switch 80 is open, and switch 78 is closed.

At operation 164, control circuitry 14 may use VSWR sensor 32 to measure a forward background IQ signal $S_{BG\_FW}$. During this measurement, antenna switch 94 is closed, FW switch 74 is closed, RW switch 76 is open, switch 80 is closed, and switch 78 is open.

At operation 166, control circuitry 14 may perform an additional calibration step by using VSWR sensor 32 to measure a forward open switch background IQ signal $S_{BG\_OPEN}$. During this measurement, both FW switch 74 and RW switch 76 are open.

At operation 168, control circuitry 14 may use VSWR sensor 32 to measure a reverse real time in-phase quadrature-phase (IQ) signal $S_{RT\_RW}$. During this measurement, antenna switch 94 is closed, FW switch 74 is open, RW switch 76 is closed, switch 80 is open, and switch 78 is closed.

At operation 170, control circuitry 14 may use VSWR sensor 32 to measure a forward real time in-phase quadrature-phase (IQ) signal $S_{RT\_FW}$. During this measurement, antenna switch 94 is closed, FW switch 74 is closed, RW switch 76 is open, switch 80 is closed, and switch 78 is open.

At operation 172, control circuitry 14 may perform an additional calibration step by using VSWR sensor 32 to measure a forward open switch real time IQ signal $S_{RT\_OPEN}$. During this measurement, both FW switch 74 and RW switch 76 are open.

At operation 174, control circuitry 14 may generate USR index value USR_INDEX according to the equation USR_INDEX=$[(S_{RT\_RW}-S_{RT\_OPEN})/(S_{RT\_FW}-S_{RT\_OPEN})]-[(S_{BG\_RW}-S_{BG\_OPEN})/(S_{BG\_FW}-S_{BG\_OPEN})]$ (e.g., when performing the subtraction in operation 136 of FIG. 5). IQ signals $S_{RT\_FW}$, $S_{BG\_FW}$, $S_{RT\_RW}$, $S_{BG\_FW}$, $S_{RT\_OPEN}$, and $S_{BG\_OPEN}$ may be complex values whereas USR index value USR_INDEX is a real-valued scalar. Calculating USR_INDEX in this way may provide a relatively robust USR object detection for device 10. The example of FIG. 7 is merely illustrative. If desired, wireless circuitry 24 may further calibrate USR index value USR_INDEX using matched load 88 of FIG. 3.

Figure 8:
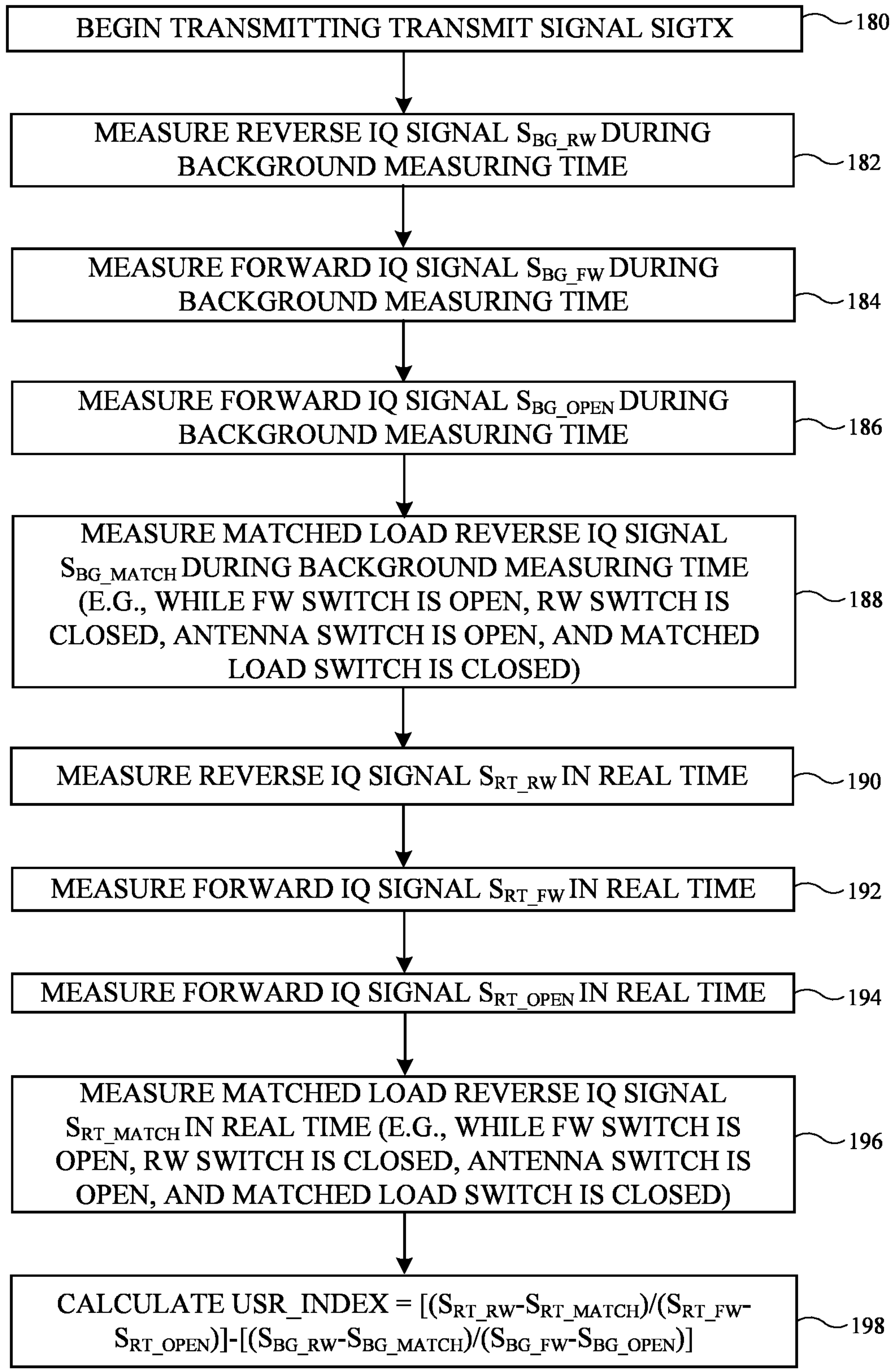
FIG. 8 is a flow chart of illustrative operations involved in generating background-cancelled USR index values that are calibrated using a matched load in accordance with some embodiments.

FIG. 8 is a flow chart of illustrative operations that may be performed by control circuitry 14 when gathering VSWR measurements that are calibrated using matched load 88. Operations 180-188 of FIG. 8 may be performed during operation 124 of FIG. 5, operations 190-196 of FIG. 8 may be performed during operation 134 of FIG. 5, and operation 198 may be performed during operation 136 of FIG. 5, for example.

At operation 182, control circuitry 14 may use VSWR sensor 32 to measure reverse background IQ signal $S_{BG\_RW}$. During this measurement, antenna switch 94 of FIG. 3 is closed, matched load switch 90 is open, FW switch 74 is open, RW switch 76 is closed, switch 80 is open, and switch 78 is closed.

At operation 184, control circuitry 14 may use VSWR sensor 32 to measure forward background IQ signal $S_{BG\_FW}$. During this measurement, antenna switch 94 is closed, matched load switch 90 is open, FW switch 74 is closed, RW switch 76 is open, switch 80 is closed, and switch 78 is open.

At operation 186, control circuitry 14 may use VSWR sensor 32 to measure a forward open switch background IQ signal $S_{BG\_OPEN}$. During this measurement, both FW switch 74 and RW switch 76 are open.

At operation 188, control circuitry 14 may perform an additional calibration step by using VSWR sensor 32 to measure a reverse background matched load IQ signal $S_{BG\_MATCH}$. During this measurement, antenna switch 94 is open, matched load switch 90 is closed, FW switch 74 is open, RW switch 76 is closed, switch 80 is open, and switch 78 is closed.

At operation 190, control circuitry 14 may use VSWR sensor 32 to measure reverse real time IQ signal $S_{RT\_RW}$. During this measurement, antenna switch 94 is closed, matched load switch 90 is open, FW switch 74 is open, RW switch 76 is closed, switch 80 is open, and switch 78 is closed.

At operation 192, control circuitry 14 may use VSWR sensor 32 to measure forward real time IQ signal $S_{RT\_FW}$. During this measurement, antenna switch 94 is closed, matched load switch 90 is open, FW switch 74 is closed, RW switch 76 is open, switch 80 is closed, and switch 78 is open.

At operation 194, control circuitry 14 may use VSWR sensor 32 to measure a forward open switch real time IQ signal $S_{RT\_OPEN}$. During this measurement, both FW switch 74 and RW switch 76 are open.

At operation 196, control circuitry 14 may perform an additional calibration step by using VSWR sensor 32 to measure a reverse real time matched load IQ signal $S_{BG\_MATCH}$. During this measurement, antenna switch 94 is open, matched load switch 90 is closed, FW switch 74 is open, RW switch 76 is closed, switch 80 is open, and switch 78 is closed.

At operation 198, control circuitry 14 may generate USR index value USR_INDEX according to the equation USR_INDEX=$[(S_{RT\_RW}-S_{RT\_MATCH})/(S_{RT\_FW}-S_{RT\_OPEN})]-[(S_{BG\_RW}-S_{BG\_MATCH})/(S_{BG\_FW}-S_{BG\_OPEN})]$. Calculating USR_INDEX in this way may provide a relatively robust USR object detection for device 10. The examples of FIGS. 7 and 8 are merely illustrative. While the calibration operations are described in FIGS. 7 and 8 in the context of USR detection, these calibration operations may be used to calibrate any directional coupler-based VSWR sensor for use in performing any desired VSWR measurements.

Switches 78, 80, 74, 76, 90, and 94 of FIG. 3 may be implemented using any desired switching architecture. When referred to herein as "open," each switch 78, 80, 74, 76, 90, and 94 may form a very high impedance or very low transconductance $g_m$ through the switch (e.g., an impedance that exceeds a threshold impedance value or a transconductance that is less than a threshold transconductance value). When referred to herein as "closed," each switch 78, 80, 74, 76, 90, and 94 may form a very low impedance or very high transconductance $g_m$ through the switch (e.g., an impedance that exceeds a threshold impedance value or a transconductance that is less than a threshold transconductance value). As an example, switches such as switches 78, 80, 74, 76, 90, and 94 may each be formed using transistors having source, drain, and gate terminals. Each switch may be closed or "turned on" by asserting a gate voltage provided to the gate terminal to provide an electrical connection between its source and drain terminals. Similarly, each switch may be opened or "turned off" by deasserting the gate voltage to provide electrical isolation between its source and drain terminals.

The methods and operations described above in connection with FIGS. 1-8 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry 18 of FIG. 1, etc.). The processing circuitry may include microprocessors, central processing units (CPUs), application-specific integrated circuits with processing circuitry, or other processing circuitry. The components of FIGS. 1 and 3 may be implemented using hardware (e.g., circuit components, digital logic gates, etc.) and/or using software where applicable.

The foregoing is merely illustrative and various modifications can be made to the described embodiments. The foregoing embodiments may be implemented individually or in any combination.

What is claimed is:

1. An electronic device comprising:
- a transmit antenna;
- a receive antenna;
- a voltage standing wave ratio (VSWR) sensor communicably coupled to the transmit antenna; and
- one or more processors configured to
  - use the transmit antenna and the receive antenna to perform spatial ranging operations on external objects located greater than a threshold distance away from the transmit antenna, and
  - use the VSWR sensor to detect an external object located within the threshold distance from the transmit antenna.

2. The electronic device of claim 1, further comprising radar circuitry communicably coupled to the transmit antenna over a transmit path and communicably coupled to the receive antenna over a receive path, wherein the VSWR sensor is disposed on the transmit path between the radar circuitry and the transmit antenna.

3. The electronic device of claim 2, wherein the radar circuitry is configured to:
- transmit radar signals using the transmit antenna; and
- receive a reflected version of the radar signals using the receive antenna, the one or more processors being configured to perform the spatial ranging operations by processing the radar signals transmitted using the transmit antenna and the reflected version of the radar signals received using the receive antenna.

4. The electronic device of claim 3, further comprising:
- a wireless communications transceiver communicably coupled to the transmit antenna over the transmit path, wherein the wireless communications transceiver is configured transmit wireless communications data using the transmit antenna.

5. The electronic device of claim 4, wherein the one or more processors is configured to use the VSWR sensor to detect the external object within the threshold distance from the transmit antenna by:
- measuring VSWR values using radio-frequency transmit signals that include the wireless communications data transmitted by the wireless communications transceiver.

6. The electronic device of claim 4, further comprising:
- a signal generator separate from the wireless communications transceiver and separate from the radar circuitry, wherein the signal generator is configured to generate radio-frequency test signals and wherein the one or more processors is configured to use the VSWR sensor to detect the external object within the threshold distance from the transmit antenna by measuring VSWR values using the radio-frequency test signals transmitted by the signal generator.

7. The electronic device of claim 3, wherein the one or more processors is configured to use the VSWR sensor to detect the external object within the threshold distance from the transmit antenna by:
- measuring VSWR values using the radar signals transmitted by the radar circuitry.

8. The electronic device of claim 2, wherein the one or more processors is configured to use the VSWR sensor to detect the external object by:
- measuring a background VSWR value using the VSWR sensor;
- measuring a real time VSWR value using the VSWR sensor; and
- identifying that the external object is present within the threshold distance from the transmit antenna when a difference value between the real time VSWR value and the background VSWR value exceeds a threshold value.

9. The electronic device of claim 8, wherein the one or more processors is configured to:
- reduce a transmit power level of the transmit antenna in response to identifying that the external object is present within the threshold distance from the transmit antenna.

10. The electronic device of claim 8, wherein the one or more processors is configured to:
- gather wireless performance metric data;
- measure the background VSWR value using the VSWR sensor when the gathered wireless performance metric data is within a predetermined range of wireless performance metric values; and measure the real time VSWR value using the VSWR sensor when the gathered wireless performance metric data is outside of the predetermined range of wireless performance metric values.

11. The electronic device of claim 10, wherein the wireless performance metric data comprises signal-to-noise ratio (SNR) data or receive signal strength indicator (RSSI) data gathered in response to radio-frequency signals received by the receive antenna.

12. The electronic device of claim 8, further comprising: a temperature sensor configured to measure a temperature value when the VSWR sensor measures the real time VSWR value, wherein the one or more processors is configured to identify a stored background VSWR value as the background VSWR value and wherein the stored background VSWR value corresponds to the temperature value measured by the temperature sensor.

13. A method of operating wireless circuitry to perform external object detection, the method comprising:

transmitting, using a transmit antenna, a radar signal;

receiving, using a receive antenna, a reflected version of the radar signal transmitted by the transmit antenna;

identifying, using one or more processors, a range from the transmit antenna to an external object farther than a threshold distance from the transmit antenna based on the radar signal transmitted by the transmit antenna and the reflected version of the radar signal received by the receive antenna;

generating, using a voltage standing wave ratio (VSWR) sensor, a background VSWR measurement and a real time VSWR measurement for the transmit antenna; and identifying, using the one or more processors, that the external object is closer than the threshold distance from the transmit antenna when a difference between the real time VSWR measurement and the background VSWR measurement exceeds a threshold value.

14. The method of claim 13, further comprising:

controlling, using the one or more processors, the VSWR sensor to generate the background VSWR measurement for the transmit antenna when wireless performance metric data associated with the reception of radio-frequency signals by the receive antenna is within a predetermined range of wireless performance metric values; and controlling, using the one or more processors, the VSWR sensor to generate the real time VSWR measurement for the transmit antenna when the gathered wireless performance metric data is outside of the predetermined range of wireless performance metric values.

15. The method of claim 13, further comprising:

reducing a maximum transmit power level of the radio-frequency signals transmitted by the transmit antenna when the external object is identified as being closer than the threshold distance.

16. The method of claim 13, further comprising:

switching a new transmit antenna into use when the external object is identified as being closer than the threshold distance.

17. A method of operating an electronic device having a transmit antenna, a receive antenna, a voltage standing wave ratio (VSWR) sensor communicably coupled to the transmit antenna, and one or more processors, the method comprising:

performing, using the transmit antenna and the receive antenna, spatial ranging operations on external objects located greater than a threshold distance away from the transmit antenna; and detecting, using the VSWR sensor, an external object located within the threshold distance from the transmit antenna.

18. The method of claim 17, further comprising:

transmitting, using radar circuitry communicably coupled to the transmit antenna over a transmit path, radar signals, wherein the radar circuitry is communicably coupled to the receive antenna over a receive path, the VSWR sensor being disposed on the transmit path between the radar circuitry and the transmit antenna.

19. The method of claim 18, further comprising:

receiving, using the receive antenna, a reflected version of the radar signals; and performing, using the one or more processors, the spatial ranging operations based on the radar signals transmitted using the transmit antenna and the reflected version of the radar signals received using the receive antenna.

20. The method of claim 19, further comprising:

transmitting, using a wireless communications transceiver communicably coupled to the transmit antenna over the transmit path, wireless communications data over the transmit antenna.

* * * * *